United States Patent
Garcia

(10) Patent No.: US 11,671,070 B2
(45) Date of Patent: Jun. 6, 2023

(54) TRANSVERSELY-EXCITED FILM BULK ACOUSTIC RESONATORS USING MULTIPLE DIELECTRIC LAYER THICKNESSES TO SUPPRESS SPURIOUS MODES

(71) Applicant: Murata Manufacturing Co., Ltd., Nagaokakyo (JP)

(72) Inventor: Bryant Garcia, Burlingame, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 214 days.

(21) Appl. No.: 17/093,257

(22) Filed: Nov. 9, 2020

(65) Prior Publication Data
US 2022/0060175 A1   Feb. 24, 2022

Related U.S. Application Data

(60) Provisional application No. 63/067,327, filed on Aug. 19, 2020.

(51) Int. Cl.
*H03H 9/02* (2006.01)
*H03H 9/205* (2006.01)
*H03H 9/56* (2006.01)

(52) U.S. Cl.
CPC .... *H03H 9/02157* (2013.01); *H03H 9/02228* (2013.01); *H03H 9/205* (2013.01); *H03H 9/568* (2013.01); *H03H 2009/02173* (2013.01)

(58) Field of Classification Search
CPC ............... H03H 9/205; H03H 9/02157; H03H 9/02228; H03H 9/568; H03H 2009/02173; H03H 2003/0442; H03H 9/174

(Continued)

(56) References Cited

U.S. PATENT DOCUMENTS 5,446,330 A   8/1995   Eda et al.
5,552,655 A   9/1996   Stokes et al.
(Continued)

FOREIGN PATENT DOCUMENTS

WO   2016017104        2/2016
WO   2018003273 A1   1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Rakesh B Patel
*Assistant Examiner* — Jorge L Salazar, Jr.
(74) *Attorney, Agent, or Firm* — ArentFox Schiff LLP

(57) ABSTRACT

Acoustic filters and methods of fabricating acoustic filters are disclosed. A filter includes a single-crystal piezoelectric plate having a front surface and a back surface attached to a substrate, and a plurality of acoustic resonators including a first shunt resonator, a second shunt resonator, and one or more series resonators. Each of the plurality of acoustic resonators includes an interdigital transducer (IDT) formed on the front surface of the piezoelectric plate, interleaved fingers of the IDT disposed on a respective diaphragm formed by a portion of the piezoelectric plate that spans a cavity in the substrate. A frequency setting dielectric layer is formed over the first and second shunt resonators but not over the one or more series resonators. The frequency setting dielectric layer has a thickness t1 on the first shunt resonator and a thickness t2 on the second shunt resonator, where t1 is not equal to t2.

24 Claims, 8 Drawing Sheets

(58) Field of Classification Search
USPC .......................................... 333/133, 193–196
See application file for complete search history.

(56) References Cited

U.S. PATENT DOCUMENTS

| | | | |
|---|---|---|---|
| 5,726,610 | A | 3/1998 | Allen et al. |
| 5,853,601 | A | 12/1998 | Krishaswamy |
| 6,377,140 | B1 | 4/2002 | Ehara et al. |
| 6,516,503 | B1 | 2/2003 | Ikada et al. |
| 6,540,827 | B1 | 4/2003 | Levy et al. |
| 6,707,229 | B1 | 3/2004 | Martin |
| 6,710,514 | B2 | 3/2004 | Ikada et al. |
| 7,345,400 | B2 | 3/2008 | Nakao et al. |
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,728,483 | B2 | 6/2010 | Tanaka |
| 7,868,519 | B2 | 1/2011 | Umeda |
| 7,941,103 | B2 | 5/2011 | Iwamoto et al. |
| 8,278,802 | B1 | 10/2012 | Lee et al. |
| 8,294,330 | B1 | 10/2012 | Abbott et al. |
| 8,344,815 | B2 | 1/2013 | Yamanaka |
| 8,816,567 | B2 | 8/2014 | Zuo et al. |
| 8,829,766 | B2 | 9/2014 | Milyutin et al. |
| 8,932,686 | B2 | 1/2015 | Hayakawa et al. |
| 9,093,979 | B2 | 7/2015 | Wang |
| 9,130,145 | B2 | 9/2015 | Martin et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,640,750 | B2 | 5/2017 | Nakanishi et al. |
| 9,748,923 | B2 | 8/2017 | Kando et al. |
| 9,762,202 | B2 | 9/2017 | Thalmayr et al. |
| 9,780,759 | B2 | 10/2017 | Kimura et al. |
| 9,837,984 | B2 | 12/2017 | Khlat et al. |
| 10,079,414 | B2 | 9/2018 | Guyette et al. |
| 10,187,039 | B2 | 1/2019 | Komatsu et al. |
| 10,200,013 | B2 | 2/2019 | Bower et al. |
| 10,211,806 | B2 | 2/2019 | Bhattacharjee |
| 10,284,176 | B1 | 5/2019 | Solal |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,644,674 | B2 | 5/2020 | Takamine |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,826,462 | B2 | 11/2020 | Plesski et al. |
| 10,868,512 | B2 | 12/2020 | Garcia et al. |
| 10,917,070 | B2 | 2/2021 | Plesski et al. |
| 2002/0079986 | A1 | 6/2002 | Ruby et al. |
| 2002/0158714 | A1 | 10/2002 | Kaitila et al. |
| 2002/0189062 | A1 | 12/2002 | Lin et al. |
| 2003/0080831 | A1 | 5/2003 | Naumenko |
| 2003/0199105 | A1 | 10/2003 | Kub et al. |
| 2004/0100164 | A1 | 5/2004 | Murata |
| 2004/0261250 | A1 | 12/2004 | Kadota et al. |
| 2005/0185026 | A1 | 8/2005 | Noguchi et al. |
| 2005/0218488 | A1 | 10/2005 | Matsuo |
| 2005/0264136 | A1 | 12/2005 | Tsutsumi et al. |
| 2006/0179642 | A1 | 8/2006 | Kawamura |
| 2007/0182510 | A1 | 8/2007 | Park |
| 2007/0188047 | A1 | 8/2007 | Tanaka |
| 2007/0194863 | A1 | 8/2007 | Shibata et al. |
| 2007/0267942 | A1 | 11/2007 | Matsumoto et al. |
| 2008/0246559 | A1 | 10/2008 | Ayaz |
| 2010/0064492 | A1 | 3/2010 | Tanaka |
| 2010/0123367 | A1 | 5/2010 | Tai et al. |
| 2011/0018389 | A1 | 1/2011 | Fukano et al. |
| 2011/0018654 | A1 | 1/2011 | Bradley et al. |
| 2011/0109196 | A1 | 5/2011 | Goto |
| 2011/0278993 | A1 | 11/2011 | Iwamoto |
| 2012/0286900 | A1 | 11/2012 | Kadota et al. |
| 2013/0234805 | A1 | 9/2013 | Takahashi |
| 2013/0271238 | A1 | 10/2013 | Onda |
| 2013/0278609 | A1 | 10/2013 | Stephanou et al. |
| 2013/0321100 | A1 | 12/2013 | Wang |
| 2014/0009032 | A1* | 1/2014 | Takahashi .......... H03H 9/02228 29/25.35 |
| 2014/0130319 | A1 | 5/2014 | Iwamoto |
| 2014/0145556 | A1 | 5/2014 | Kadota |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2014/0225684 | A1 | 8/2014 | Kando et al. |
| 2015/0042417 | A1 | 2/2015 | Onodera et al. |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214381 | A1 | 7/2017 | Bhattacharjee |
| 2017/0214387 | A1 | 7/2017 | Burak et al. |
| 2017/0222617 | A1 | 8/2017 | Mizoguchi |
| 2017/0222622 | A1 | 8/2017 | Solal et al. |
| 2017/0370791 | A1 | 12/2017 | Nakamura et al. |
| 2018/0005950 | A1 | 1/2018 | Watanabe |
| 2018/0026603 | A1 | 1/2018 | Iwamoto |
| 2018/0033952 | A1 | 2/2018 | Yamamoto |
| 2018/0062615 | A1 | 3/2018 | Kato et al. |
| 2018/0062617 | A1 | 3/2018 | Yun et al. |
| 2018/0123016 | A1 | 5/2018 | Gong |
| 2018/0191322 | A1 | 7/2018 | Chang et al. |
| 2019/0068164 | A1 | 2/2019 | Houlden et al. |
| 2019/0123721 | A1 | 4/2019 | Takamine |
| 2019/0131953 | A1 | 5/2019 | Gong |
| 2019/0273480 | A1 | 9/2019 | Lin |
| 2019/0348966 | A1 | 11/2019 | Campanella-Pineda |
| 2020/0036357 | A1 | 1/2020 | Mimura |
| 2020/0235719 | A1 | 7/2020 | Yantchev et al. |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana—Champaign, May 2018. pp. 1-2.

Y. Yang, A. Gao et al. "5 Ghz Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics SYMPOSIUM—pp. 2110-2113. (Year: 2003).

USPTO/ISA, International Search Report and Written Opinion for PCT Application No. PCT/US2020/45654 dated Oct. 29, 2020.

(56) References Cited

OTHER PUBLICATIONS

Buchanan "Ceramit Materials for Electronics" 3rd Edition, first published in 2004 by Marcel Dekker, Inc. pp. 496 (Year 2004). Jan. 2004.
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.
Zou, Jie "High-Performance Aluminum Nitride Lamb Wave Resonators for RF Front-End Technology" University of California, Berkeley, Summer 2015, pp. 63 (Year 2015) Jan. 2015.
Santosh, G. , Surface acoustic wave devices on silicon using patterned and thin film ZnO, Ph.D. thesis, Feb. 2016, Indian Institute of technology Guwahati, Assam, India Feb. 2016.
Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.
USPTO/ISA, International Search Report and Written Opinion for PCT Application No. PCT/US2020/45654 dated Oct. 29, 2020. 2020.
Safari et al. "Piezoelectric for Transducer Applications" published by Elsevier Science Ltd., pp. 4 (Year: 2000). 2020.
Moussa et al. Review on Triggered Liposomal Drug Delivery with a Focus on Ultrasound 2015, Bentham Science Publishers, pp. 16 (Year 2005) 2005.
Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Webster Dictionary, Meaning of "diaphragm" Merriam Webster since 1828. 1828.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

TRANSVERSELY-EXCITED FILM BULK ACOUSTIC RESONATORS USING MULTIPLE DIELECTRIC LAYER THICKNESSES TO SUPPRESS SPURIOUS MODES

RELATED APPLICATION INFORMATION

This patent claims priority from provisional patent application 63/067,327, filed Aug. 19, 2020, entitled XBAR USING MULTIPLE DIELECTRIC LAYER THICKNESSES TO SUPPRESS SPURIOUS MODES. This application is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5 G NR standard also defines millimeter wave communication bands with frequencies between 24.25 GHz and 40 GHz.

The Transversely-Excited Film Bulk Acoustic Resonator (XBAR) is a resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
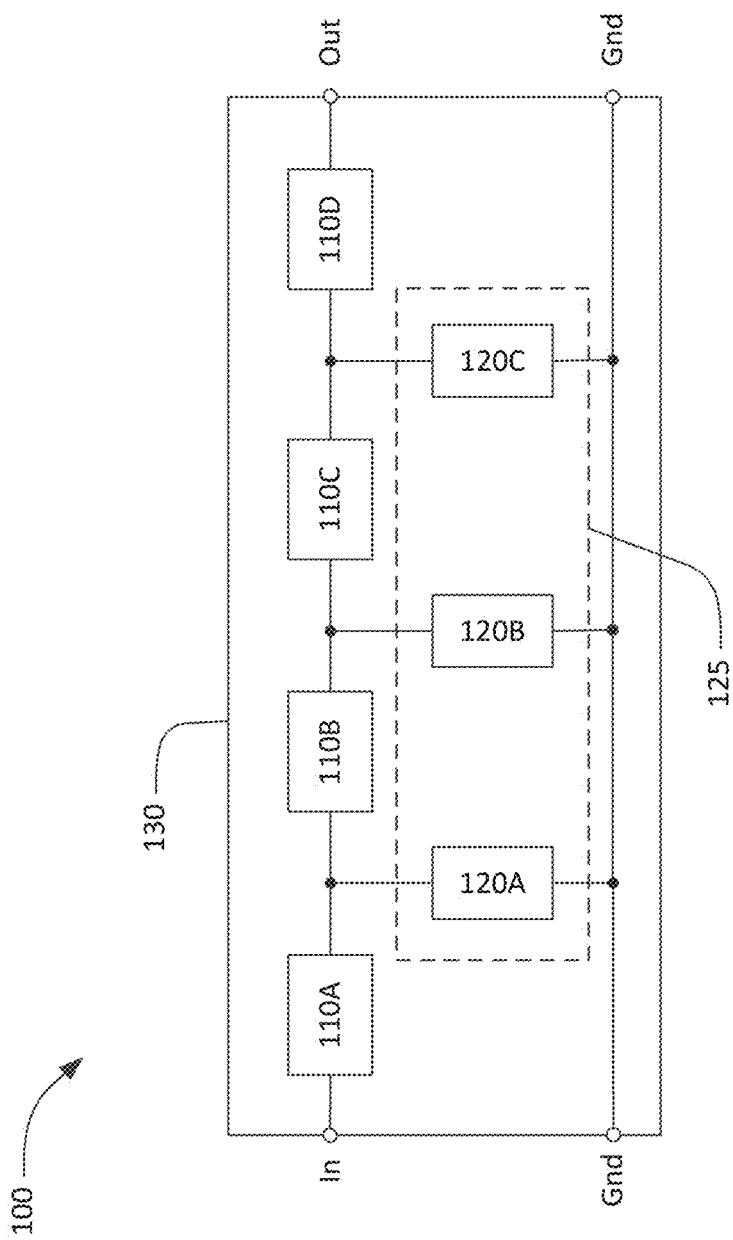
FIG. 1 is a schematic block diagram of a filter using transversely-excited film bulk acoustic resonator (XBARs).

FIG. 1 is a schematic block diagram of a high frequency band-pass filter 100 using XBARs. The filter 100 has a conventional ladder filter architecture including four series resonators 110A, 110B, 110C, 110D and three shunt resonators 120A, 120B, 120C. The series resonators 110A, 110B, 110C, and 110D are connected in series between a first port and a second port (hence the term "series resonator"). In FIG. 1, the first and second ports are labeled "In" and "Out", respectively. However, the filter 100 is bidirectional and either port may serve as the input or output of the filter. The shunt resonators 120A, 120B, 120C are connected from nodes between the series resonators to ground. A filter may contain additional reactive components, such as inductors, not shown in FIG. 1. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 100, the series resonators 110A, B, C, D and the shunt resonators 120A, B, D of the filter 100 are formed on a single plate 130 of piezoelectric material bonded to a silicon substrate (not visible). Each resonator includes a respective IDT (not shown), with at least the fingers of the IDT disposed over a cavity (not shown) in the substrate. In this and similar contexts, the term "respective" means "relating things each to each", which is to say with a one-to-one correspondence.

Each of the resonators 110A, 110B, 110C, 110D, 120A, 120B, 120C in the filter 100 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 100. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

The resonance frequency of an XBAR is primarily determined by the thickness of its diaphragm. The resonance frequency also has a slight dependence on the pitch (center-to-center spacing) and mark (line width) of interleaved fingers of its IDT. For a broad bandwidth filter, the required difference between the resonance frequencies of the shunt resonator and the resonance frequencies of the series resonators is too great to be achieved by changing IDT pitch and mark. To achieve the necessary frequency difference, a dielectric frequency setting layer is formed over the IDTs of the shunt resonators. The dielectric frequency setting layer, represented by the dashed rectangle 125, increases the thickness of the diaphragms of the shunt resonators. This lowers the resonance frequencies of the shunt resonators relative to the resonance frequencies of the series resonators.

Figure 2:
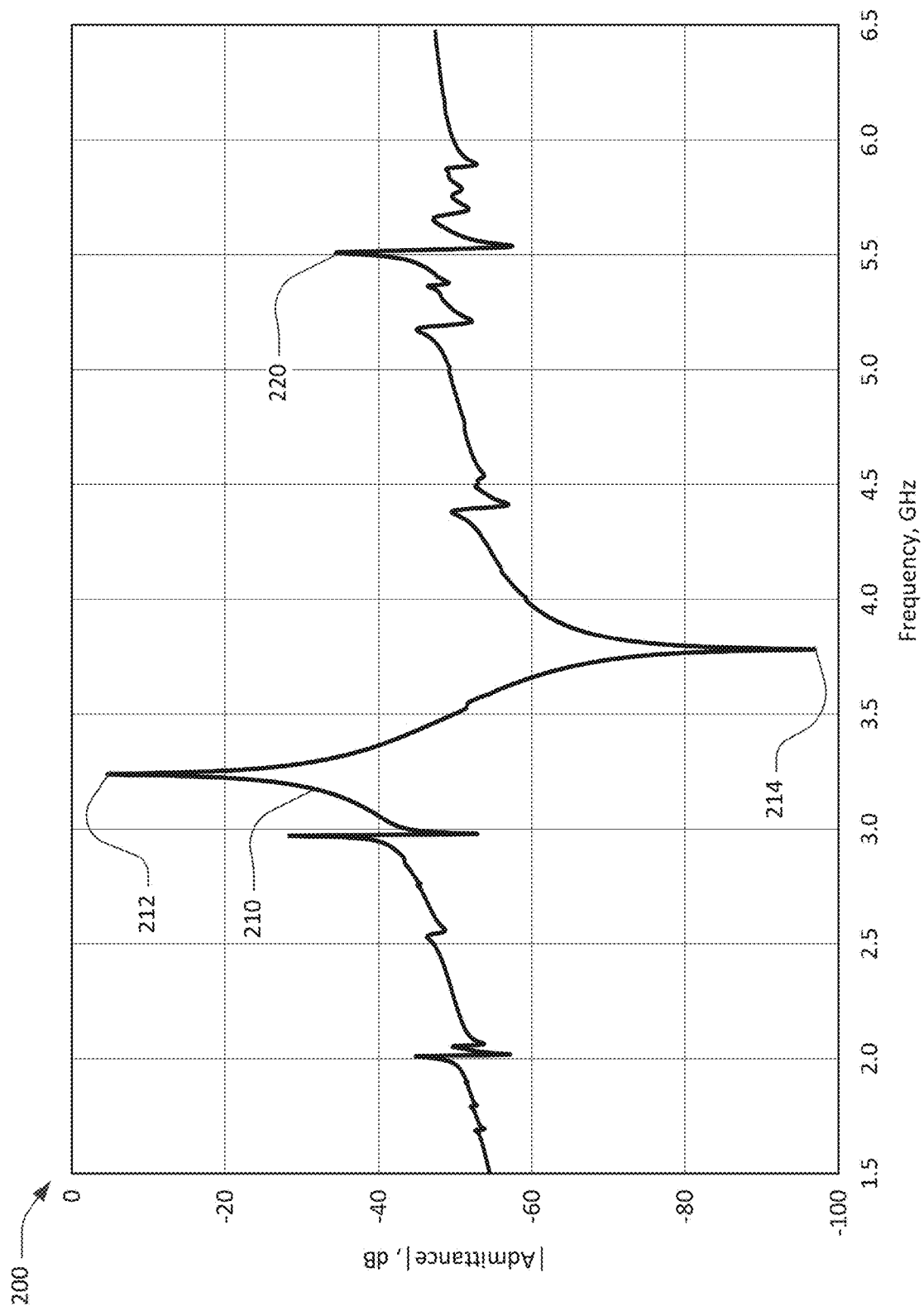
FIG. 2 is a graph of the magnitude of admittance for an XBAR with a thick frequency setting dielectric layer.

XBAR bandpass filters for wide communications bands, such as band n77, require a thick frequency setting dielectric layer on shunt resonators to establish sufficient frequency separation between shunt and series resonators. The resulting asymmetric structure allows efficient excitation of spurious acoustic modes. FIG. 2 is a graph 200 of the performance of an XBAR with a thick frequency setting dielectric layer. This XBAR is suitable for use as one of the shunt resonators 520A, 520B, 520C in the filter circuit shown in FIG. 1 Specifically, the curve 210 is a plot of the magnitude of admittance of the XBAR as a function of frequency. The XBAR has a lithium niobate piezoelectric plate 484 nm thick and a top-side $SiO_2$ frequency setting layer 161 nm thick, or 33% of the thickness of the piezoelectric plate. FIG. 2 and subsequent graphs are based on simulations of XBARs using a finite element method.

The XBAR has a resonance 212 where its admittance is maximum at a resonance frequency of 3.23 GHz. The XBAR has an anti-resonance 214 where its admittance is minimum at an anti-resonance frequency of 3.77 GHz. An A2 spurious mode 220 occurs at 5.5 GHz. The strong excitation of the A2 mode is due in large part to the asymmetric structure of the XBAR. Excitation of the A2 spurious mode may become significant when the thickness of the frequency setting dielectric layer equals or exceeds about 25% of the thickness of the piezoelectric plate.

The frequency of the A2 spurious mode 220 is determined primarily by the total thickness (piezoelectric plate plus frequency setting dielectric layer). The frequency of the A2 spurious mode has little dependence on other parameters such as IDT pitch and mark. Thus, the A2 spurious modes of all of the shunt resonators in a filter will occur at approximately the same frequency.

Figure 3:
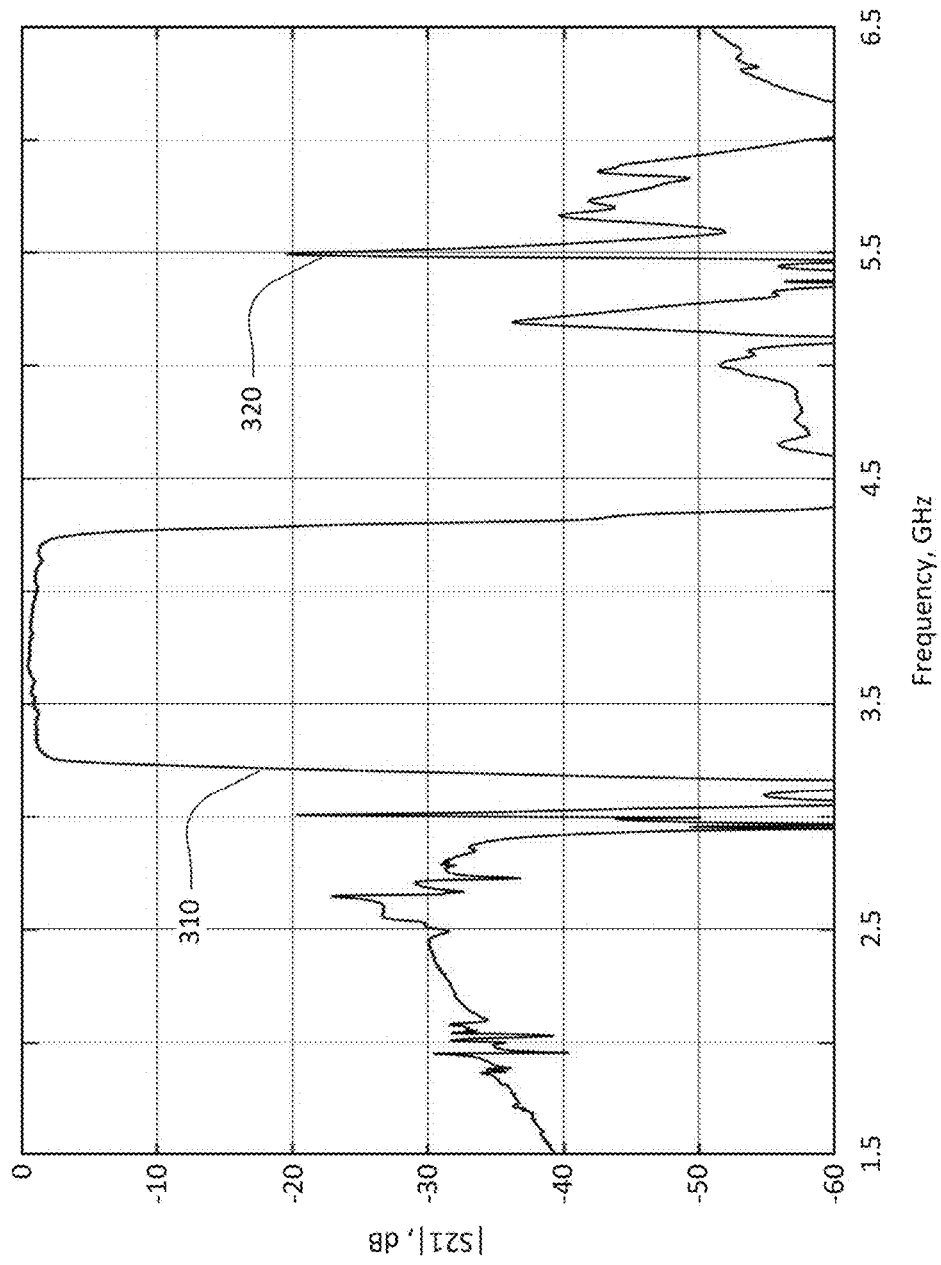
FIG. 3 is a graph of the input/output transfer function of a filter with a common frequency setting dielectric layer thickness on all shunt resonators.

FIG. 3 is graph of the performance of a broad-band bandpass filter using XBARs. Specifically, the solid curve 310 is a plot of the magnitude of S12, the input-output transfer function of the filter including three shunt resonators and four series resonators connected in a ladder filter circuit as shown in FIG. 1. The large spike 320 about 5.5 GHZ is the cumulative effect of the A2 spurious modes of the three shunt resonators in this filter. All of these shunt resonators have the same frequency setting dielectric layer thickness (33% of the piezoelectric plate thickness) as the resonator of FIG. 2. This filter has requirements on the maximum allowable value of S21 over the frequency range from 4.5 to 6.5 GHz. These requirements cannot be satisfied at 5.5 GHz due the effects of the A2 spurious modes in the shunt resonators (i.e. the spike 320).

Figure 4:
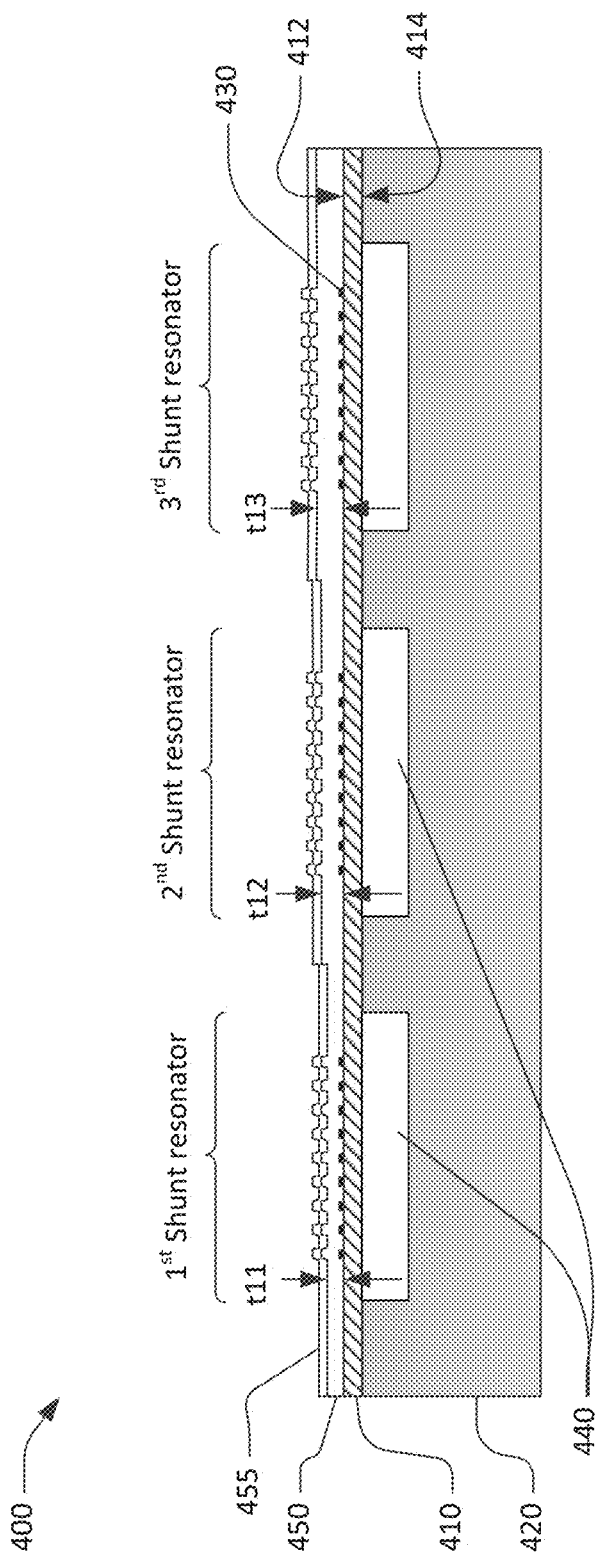
FIG. 4 is a schematic cross-sectional view of a portion of a filter with different frequency setting dielectric layer thicknesses on three shunt resonators.

FIG. 4 is a schematic cross-section view of a portion of a filter 400 with multiple frequency setting dielectric layer thicknesses. FIG. 4 shows first, second, and third shunt resonators. Each shunt resonator includes a portion of a piezoelectric plate 410 with a front surface 412 and a back surface 414. The back surface 414 is attached to a substrate 420. Portions of the piezoelectric plate 410 form diaphragms spanning cavities 440 in the substrate 420. Each of the first, second, and third shunt resonators includes a respective IDT with interleaved fingers of the IDT, such as IDT finger 430, disposed on the respective diaphragm. A frequency setting dielectric layer 450 covers the IDT fingers and the front surfaces of the diaphragms of the shunt resonators.

The frequency setting dielectric layer has a first thickness t11 over the first shunt resonator, a second thickness t12 over the second shunt resonator and a third thickness t13 over the third shunt resonator, where t11≠t12≠t13. In filters with less than or more than three shunt resonators, the thickness of the frequency setting dielectric layer over any one of the shunt resonators may be different from the thickness of the frequency setting dielectric layer over all other shunt resonators. This may be expressed as t1i≠t1j, where i and j are integers from 1 to n, where n is the number of shunt resonators in a filter, and i≠j.

Using different frequency setting dielectric layer thicknesses on the shunt resonators places the A2 mode of each shunt resonator at a slightly different frequency than the A2 modes of all other shunt resonators. This prevents the constructive addition of the A2 modes that results in the admittance spike 320 seen in FIG. 3.

A second dielectric layer 455 may be deposited over both the shunt and series resonator. The second dielectric layer 455 serves to seal and passivate the surface of the filter 400. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 400. Thus, the second dielectric layer can be referred to as the "passivation and tuning layer".

Figure 5:
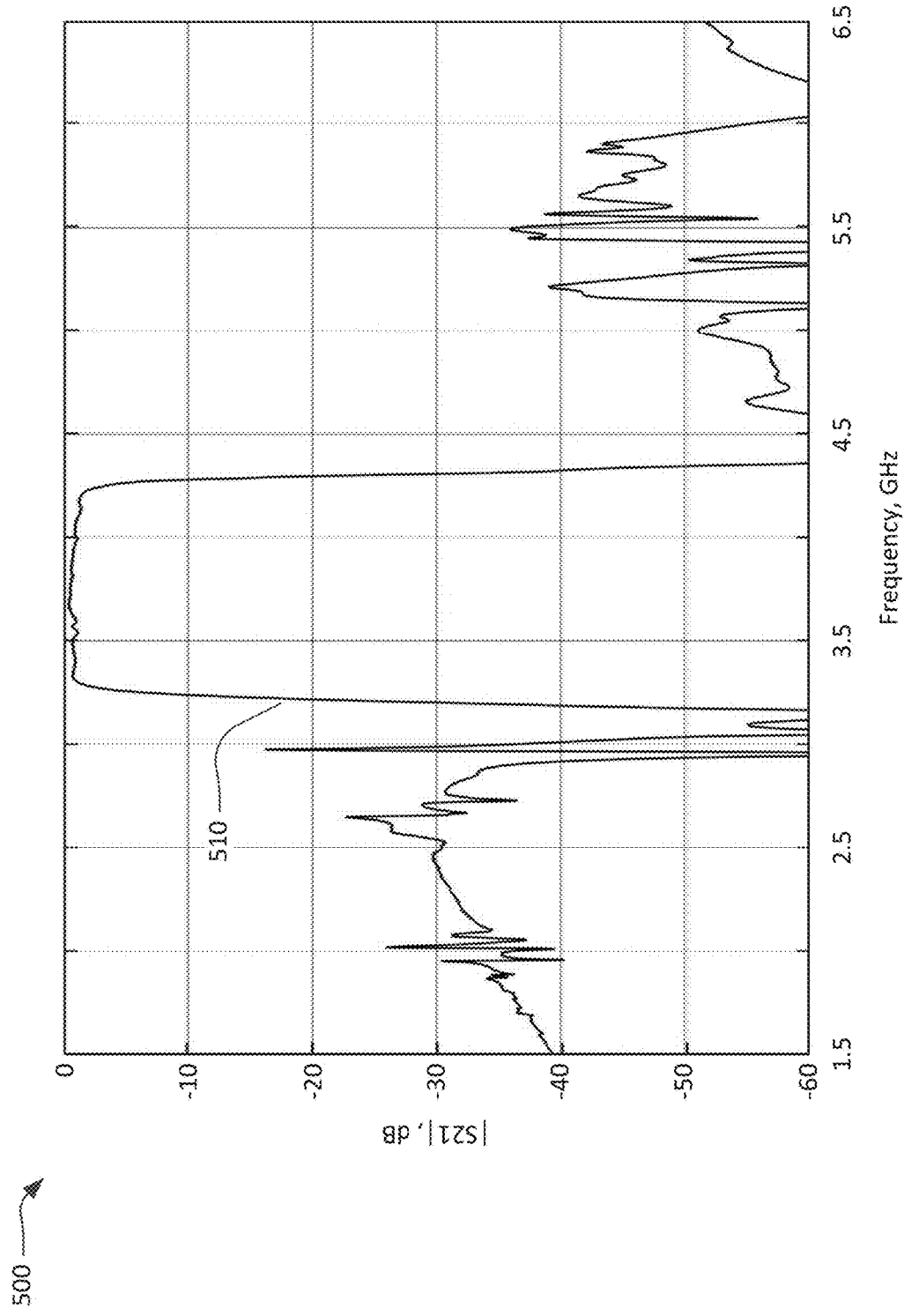
FIG. 5 is a graph of the input/output transfer function of a filter with different frequency setting dielectric layer thicknesses.

FIG. 5 is graph 500 of the performance of a broad-band bandpass filter using XBARS with multiple frequency setting dielectric layer thicknesses. Specifically, the solid curve 510 is a plot of the magnitude of S12, the input-output transfer function of a filter that is identical to the filter of FIG. 3 except for the multiple frequency setting dielectric layer thicknesses. The first, second, and third frequency setting dielectric layer thickness are 31.8%, 33.3%, and 34.3%, respectively, of the thickness of the piezoelectric plate used in the filter. The large admittance spike about 5.5 GHz seen in FIG. 3 does not exist.

The differences between the thicknesses of the first, second, and third frequency setting dielectric layers in the example are typical. In a filter with multiple shunt resonators, the thickness of the frequency setting dielectric layer over any shunt resonator will differ from the thickness of the frequency setting dielectric layer over every other shunt resonator by at least 0.5% of the piezoelectric plate thickness. In a filter with n shunt resonators, where n is an integer greater than or equal to 2, the different between the thickest and thinnest frequency setting dielectric layer formed over shunt resonators will not exceed 2(n−1)% of the piezoelectric plate thickness. For example, in a filter with two shunt resonators, the thickness of the frequency setting dielectric layer over the first shunt resonator will differ from the thickness of the frequency setting dielectric layer over the second shunt resonator by at least 0.5% and not more than 2.0% of the piezoelectric plate thickness.

Figure 6:
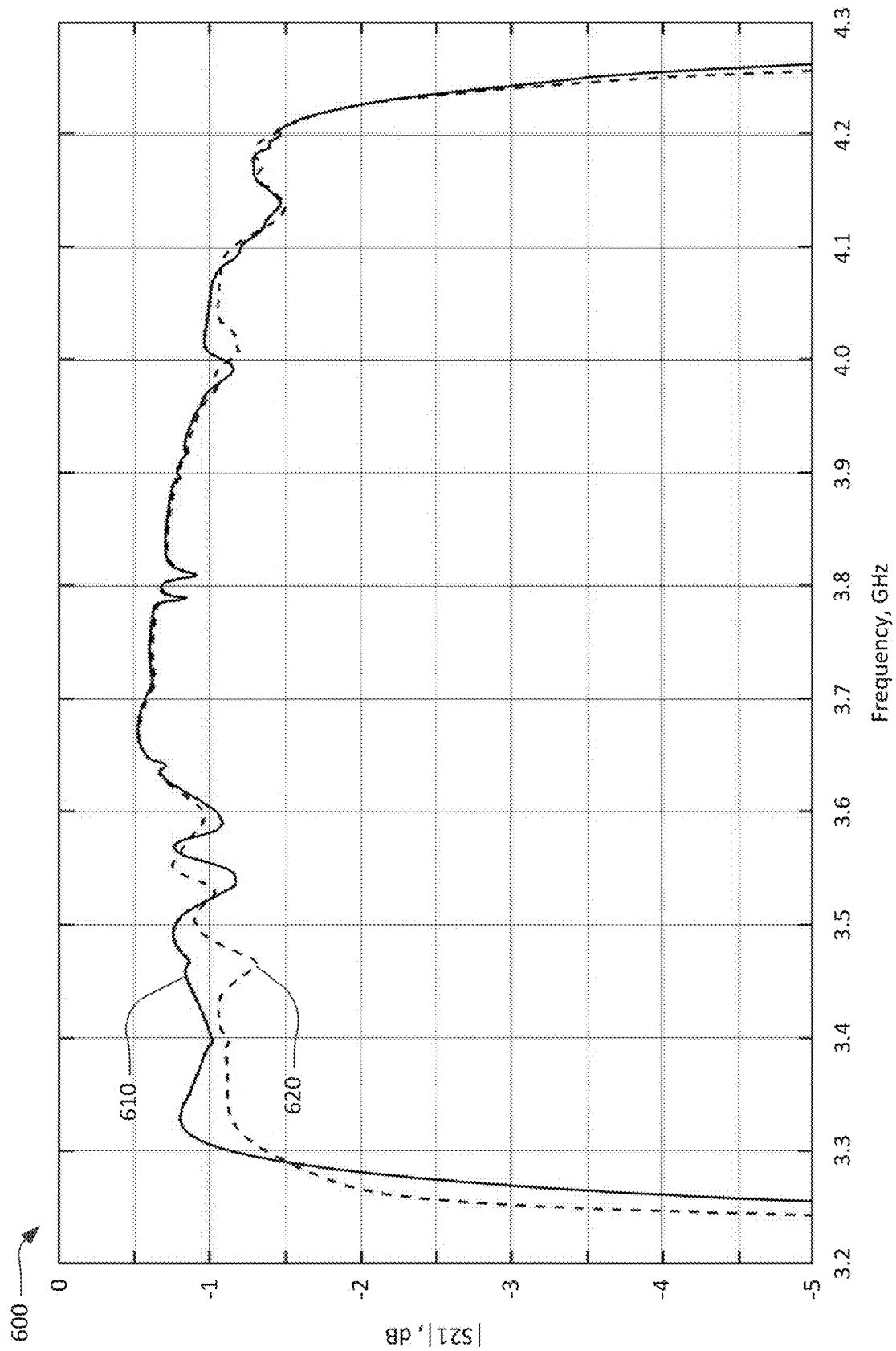
FIG. 6 is a graph comparing the performance of a filter with multiple thickness frequency setting dielectric layers and the performance of a filter with uniform thickness frequency setting dielectric layers.

FIG. 6 is graph 600 comparing the performance of a filter with multiple frequency setting dielectric layers and the performance of a filter with uniform thickness frequency setting dielectric layers. The solid line 610 is an expanded portion of the chart 500 of FIG. 5 showing the magnitude of S21 for a filter with multiple frequency setting dielectric layer thicknesses. The dashed line 620 is an expanded portion of the chart 300 of FIG. 3 showing the magnitude of S21 for a filter with uniform frequency setting dielectric layer thickness. Incorporating multiple frequency setting dielectric layer thicknesses has little effect in the passband of the filter. A slight reduction in bandwidth is evident for S21=−3 dB. The original filter bandwidth can likely be recovered by re-optimizing the mark and pitch of the shunt resonators.

Figure 7:
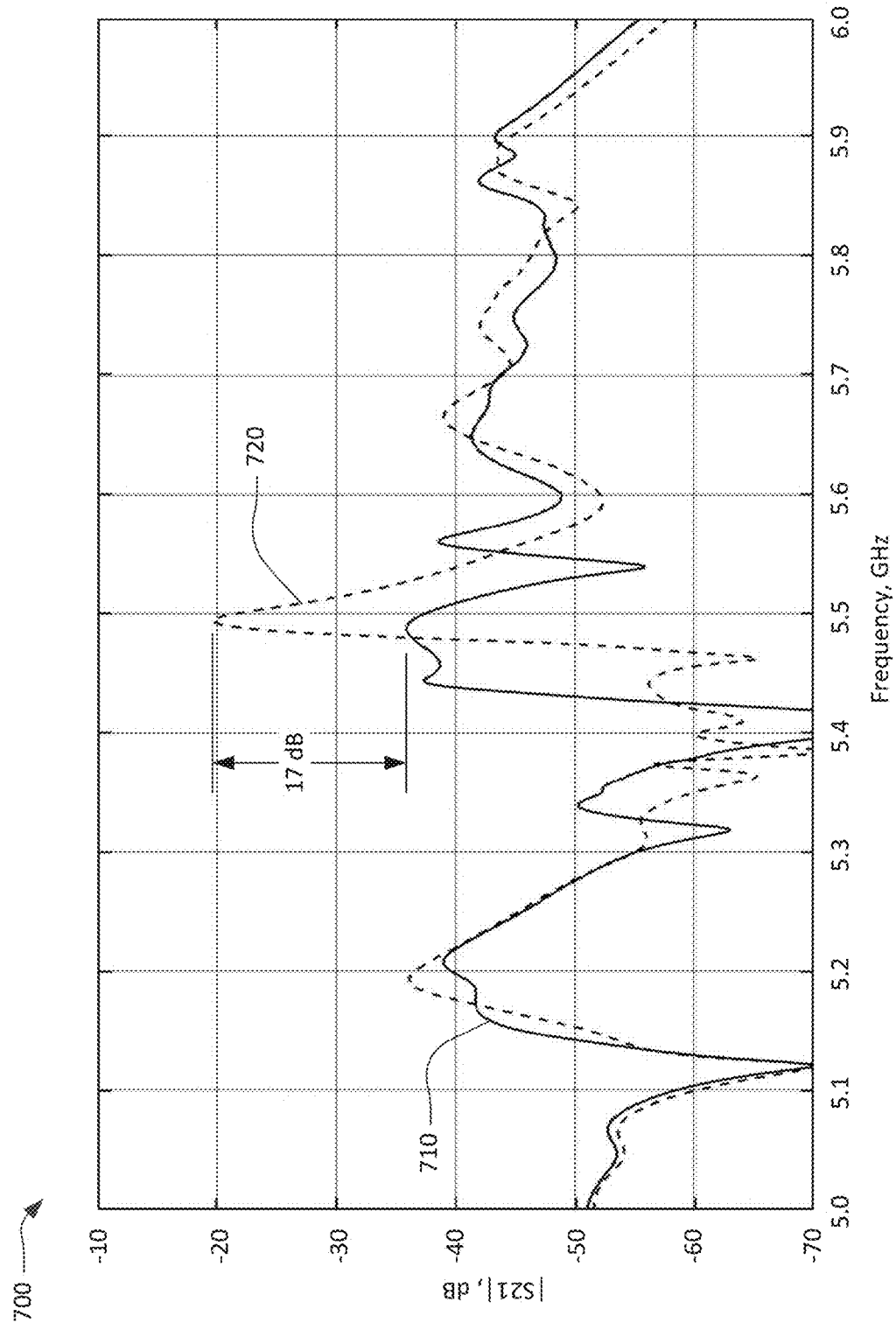
FIG. 7 is another graph comparing the performance of a filter with multiple thickness frequency setting dielectric layers and the performance of a filter with uniform thickness frequency setting dielectric layers.

FIG. 7 is another graph 700 comparing the performance of a filter with multiple frequency setting dielectric layers and the performance of a filter with uniform thickness frequency setting dielectric layers. The solid line 710 is an expanded portion of the chart 500 of FIG. 5 showing the magnitude of S21 for a filter with multiple frequency setting dielectric layer thicknesses. The dashed line 720 is an expanded portion of the chart 300 of FIG. 3 showing the magnitude of S21 for a filter with uniform frequency setting dielectric layer thickness. Incorporating multiple frequency setting dielectric layer thicknesses reduces the admittance spike at 5.5 GHz by over 17 dB.

Description of Methods

Figure 8:
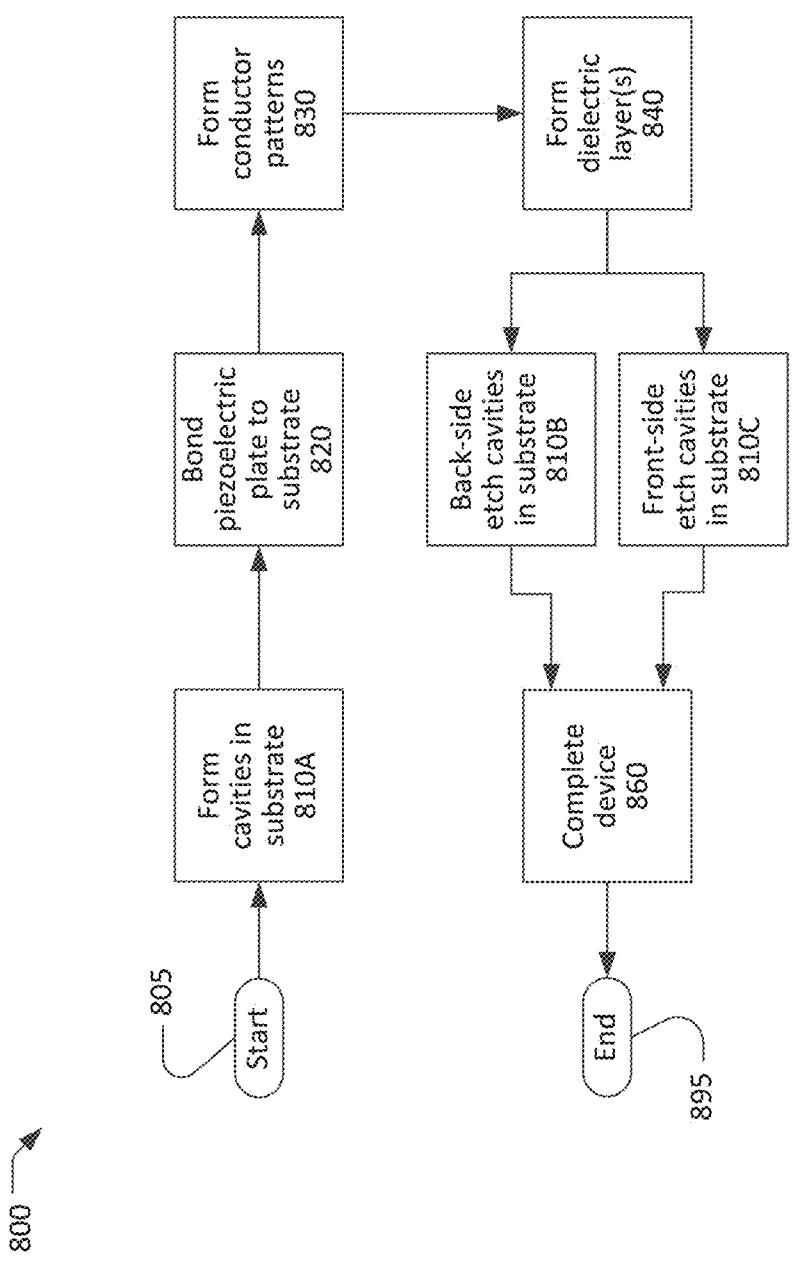
FIG. 8 is a flow chart of a process for fabricating XBARs.

FIG. 8 is a simplified flow chart showing a process 800 for making an XBAR or a filter incorporating XBARs. The process 800 starts at 805 with a substrate and a plate of piezoelectric material and ends at 895 with a completed XBAR or filter. The flow chart of FIG. 8 includes only major process steps. Various conventional process steps (e.g. surface preparation, cleaning, inspection, baking, annealing, monitoring, testing, etc.) may be performed before, between, after, and during the steps shown in FIG. 8.

The flow chart of FIG. 8 captures three variations of the process 800 for making an XBAR which differ in when and how cavities are formed in the substrate. The cavities may be formed at steps 810A, 810B, or 810C. Only one of these steps is performed in each of the three variations of the process 800.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 800, one or more cavities are formed in the substrate at 810A, before the piezoelectric plate is bonded to the substrate at 820. A separate cavity may be formed for each resonator in a filter device. The one or more cavities may be formed using conventional photolithographic and etching techniques. Typically, the cavities formed at 810A will not penetrate through the substrate, and the resulting resonator devices will have a cross-section as shown in FIG. 4.

At 820, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 830 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 830 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 830 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 840, a front-side dielectric layer or frequency setting dielectric layer may be formed by depositing one or more layers of dielectric material on the front side of the piezoelectric plate. The frequency setting dielectric layer may be silicon dioxide, silicon nitride, aluminum oxide, aluminum nitride, beryllium oxide, tantalum oxide, tungsten oxide, or some other dielectric material.

The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of a frequency setting dielectric layer on different portions of the piezoelectric plate corresponding to different shunt resonators.

Alternatively, a uniform thickness frequency setting dielectric layer may be formed over all shunt resonators. Subsequently, material me be selectively removed from shunt resonators to provide multiple frequency setting dielectric layer thicknesses. Material may be removed, for example using masked etching or using a selective material removal tool such as a scanning ion mill.

In a second variation of the process 800, one or more cavities are formed in the back side of the substrate at 810B. A separate cavity may be formed for each resonator in a filter device. The one or more cavities may be formed using an anisotropic or orientation-dependent dry or wet etch to open holes through the back-side of the substrate to the piezoelectric plate.

In a third variation of the process 800, one or more cavities in the form of recesses in the substrate may be formed at 810C by etching the substrate using an etchant introduced through openings in the piezoelectric plate. A separate cavity may be formed for each resonator in a filter device. The one or more cavities formed at 810C will not penetrate through the substrate, and the resulting resonator devices will have a cross-section as shown in FIG. 4.

In all variations of the process 800, the filter device is completed at 860. Actions that may occur at 860 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 860 is to tune the resonant frequencies of the resonators within the device by adding or removing metal or dielectric material from the front side of the device. This tuning may also include selectively removing material from shunt resonators to create multiple frequency setting dielectric layer thicknesses. After the filter device is completed, the process ends at 895.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to It is claimed:

1. A filter device, comprising:
a substrate;
a single-crystal piezoelectric plate having front and back surfaces, the back surface attached to a surface of the substrate; and
a plurality of acoustic resonators including a first shunt resonator, a second shunt resonator, and one or more series resonators, each of the plurality of acoustic resonators including an interdigital transducer (IDT) at the piezoelectric plate, interleaved fingers of the IDT at a respective diaphragm formed by a respective portion of the piezoelectric plate that spans a respective cavity in the substrate; and
a frequency setting dielectric layer over the first and second shunt resonators but not over the one or more series resonators,
wherein the frequency setting dielectric layer has a thickness t1 on the first shunt resonator and a thickness t2 on the second shunt resonator, where t1 is not equal to t2.

2. The filter device of claim 1, wherein a magnitude of a difference between t1 and t2 is greater than or equal to 0.5% of a thickness of the piezoelectric plate and less than or equal to 2% of the thickness of the piezoelectric plate.

3. The filter device of claim 1, wherein t1 and t2 are both greater than or equal to 25% of a thickness of the piezoelectric plate.

4. The filter device of claim 1, wherein the frequency setting dielectric layer comprises one or more material selected from silicon dioxide, silicon nitride, aluminum oxide, aluminum nitride, beryllium oxide, tantalum oxide, and tungsten oxide.

5. The filter device of claim 1, wherein the piezoelectric plate and the IDTs of the plurality of acoustic resonators are configured such that a respective radio frequency signal applied to each IDT excites a respective shear primary acoustic mode in the respective diaphragm.

6. The filter device of claim 1, wherein:
the plurality of acoustic resonators comprises n shunt resonators including the first and second shunt resonators, where n is an integer greater than or equal to two, and
a respective thickness of the frequency setting dielectric layer over each of the n shunt resonators is different from thicknesses of the frequency setting dielectric layer over all other shunt resonators.

7. A filter device, comprising:
a substrate;
a single-crystal piezoelectric plate having front and back surfaces, the back surface attached to a surface of the substrate; and
a plurality of acoustic resonators including n shunt resonators, where n is an integer greater than one, and one or more series resonator connected in a ladder filter circuit, each of the plurality of acoustic resonators including an interdigital transducer (IDT) at the piezoelectric plate, interleaved fingers of the IDT at a respective diaphragm formed by a respective portion of the piezoelectric plate that spans a respective cavity in the substrate; and
a frequency setting dielectric layer over all of the n shunt resonators but not over the one or more series resonators,
wherein a thickness of the frequency setting dielectric layer over any one of the n shunt resonators is different from thicknesses of the frequency setting dielectric layer over all others of the n shunt resonators.

8. The filter device of claim 7, wherein a magnitude of a difference between a thickness of the frequency setting dielectric layer over any one of the n shunt resonators and a thickness of the frequency setting dielectric layer over any other of the n shunt resonators is greater than or equal to 0.5% of a thickness of the piezoelectric plate.

9. The filter device of claim 7, wherein a difference between a thickest frequency setting dielectric layer and a thinnest frequency setting dielectric layer over any of then shunt resonators is less than or equal to 2(n−1)% of a thickness of the piezoelectric plate.

10. The filter device of claim 7, wherein respective thicknesses of the frequency setting dielectric layer over all of the n shunt resonators are greater than or equal to 25% of a thickness of the piezoelectric plate.

11. The filter device of claim 7, wherein the frequency setting dielectric layer comprises one or more material selected from silicon dioxide, silicon nitride, aluminum oxide, aluminum nitride, beryllium oxide, tantalum oxide, and tungsten oxide.

12. The filter device of claim 7, wherein the piezoelectric plate and the IDTs of the plurality of acoustic resonators are configured such that a respective radio frequency signal applied to each IDT excites a respective shear primary acoustic mode in the respective diaphragm.

13. A filter device, comprising:
a substrate;
a single-crystal piezoelectric plate having front and back surfaces, the back surface attached to a surface of the substrate; and
a plurality of acoustic resonators including a first shunt resonator, a second shunt resonator, and one or more series resonators, each of the plurality of acoustic resonators including an interdigital transducer (IDT) at the piezoelectric plate, interleaved fingers of each IDT at a respective diaphragm formed by a respective portion of the piezoelectric plate that spans a respective cavity in the substrate; and
a frequency setting dielectric layer between the interleaved fingers of the first and second shunt resonators but not the interleave fingers of the one or more series resonators,
wherein the frequency setting dielectric layer has a thickness t1 between the interleaved fingers of the first shunt resonator and a thickness t2 between the interleaved fingers of the second shunt resonator, where t1 is not equal to t2.

14. The filter device of claim 13, wherein a magnitude of a difference between t1 and t2 is greater than or equal to 0.5% of a thickness of the piezoelectric plate and less than or equal to 2% of the thickness of the piezoelectric plate.

15. The filter device of claim 13, wherein t1 and t2 are both greater than or equal to 25% of a thickness of the piezoelectric plate.

16. The filter device of claim 13, wherein the frequency setting dielectric layer comprises one or more materials selected from silicon dioxide, silicon nitride, aluminum oxide, aluminum nitride, beryllium oxide, tantalum oxide, and tungsten oxide.

17. The filter device of claim 13, wherein the piezoelectric plate and the IDTs of the plurality of acoustic resonators are configured such that a respective radio frequency signal applied to each IDT excites a respective shear primary acoustic mode in the respective diaphragm.

18. The filter device of claim 13, wherein:
the plurality of acoustic resonators comprises n shunt resonators including the first and second shunt resonators, where n is an integer greater than or equal to two, and
a respective thickness of the frequency setting dielectric layer over each of the n shunt resonators is different from thicknesses of the frequency setting dielectric layer over all other shunt resonators.

19. A filter device, comprising:
a substrate;
a single-crystal piezoelectric plate having front and back surfaces, the back surface attached to a surface of the substrate; and
a plurality of acoustic resonators including n shunt resonators, where n is an integer greater than one, and one or more series resonator connected in a ladder filter circuit, each of the plurality of acoustic resonators including an interdigital transducer (IDT) at the piezoelectric plate, interleaved fingers of the IDT at a respective diaphragm formed by a respective portion of the piezoelectric plate that spans a respective cavity in the substrate; and
a frequency setting dielectric layer between the interleaved fingers of all of the n shunt resonators but not between the interleaved fingers of the one or more series resonators,
wherein a thickness of the frequency setting dielectric layer between the interleaved fingers of any one of the n shunt resonators is different from thicknesses of the frequency setting dielectric layer between the interleaved fingers of all others of the n shunt resonators.

20. The filter device of claim 19, wherein a magnitude of a difference between a thickness of the frequency setting dielectric layer over any one of the n shunt resonators and a thickness of the frequency setting dielectric layer over any other of the n shunt resonators is greater than or equal to 0.5% of a thickness of the piezoelectric plate.

21. The filter device of claim 19, wherein a difference between a thickest frequency setting dielectric layer and a thinnest frequency setting dielectric layer over any of then shunt resonators is less than or equal to 2(n−1)% of a thickness of the piezoelectric plate.

22. The filter device of claim 19, wherein respective thicknesses of the frequency setting dielectric layer over all of the n shunt resonators are greater than or equal to 25% of a thickness of the piezoelectric plate.

23. The filter device of claim 19, wherein the frequency setting dielectric layer comprises one or more material selected from silicon dioxide, silicon nitride, aluminum oxide, aluminum nitride, beryllium oxide, tantalum oxide, and tungsten oxide.

24. The filter device of claim 19, wherein the piezoelectric plate and the IDTs of the plurality of acoustic resonators are configured such that a respective radio frequency signal applied to each IDT excites a respective shear primary acoustic mode in the respective diaphragm.

* * * * *